US012685162B2

(12) United States Patent
Yoshimatsu et al.

(10) Patent No.: US 12,685,162 B2
(45) Date of Patent: Jul. 14, 2026

(54) COOLER AND SEMICONDUCTOR DEVICE

(71) Applicant: Mitsubishi Electric Corporation, Tokyo (JP)

(72) Inventors: Naoki Yoshimatsu, Tokyo (JP); Ryoji Murai, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 670 days.

(21) Appl. No.: 17/906,460

(22) PCT Filed: May 29, 2020

(86) PCT No.: PCT/JP2020/021280
§ 371 (c)(1),
(2) Date: Sep. 15, 2022

(87) PCT Pub. No.: WO2021/240764
PCT Pub. Date: Dec. 2, 2021

(65) Prior Publication Data
US 2023/0141875 A1     May 11, 2023

(51) Int. Cl.
*H01L 23/473* (2006.01)
*H02K 9/19* (2006.01)
(Continued)

(52) U.S. Cl.
CPC ............. *H01L 23/473* (2013.01); *H02K 9/19* (2013.01); *H02K 11/33* (2016.01); *H02M 1/327* (2021.05)

(58) Field of Classification Search
CPC ........ H01L 23/473; H02K 9/19; H02K 11/33; H02M 1/327; H02M 7/003
See application file for complete search history.

(56) References Cited

U.S. PATENT DOCUMENTS 7,564,129 B2 * 7/2009 Nakanishi ................. F28F 3/12
                                                    257/713
9,136,740 B2 * 9/2015 Isoda ..................... H02K 11/05
(Continued)

FOREIGN PATENT DOCUMENTS

DE    10 2008 016 960 A1    10/2008
DE    10 2019 219 421 A     6/2021
(Continued)

OTHER PUBLICATIONS

An Office Action mailed by the Japanese Patent Office on Oct. 4, 2022, which corresponds to Japanese Patent Application No. 2022-527429 and is related to U.S. Appl. No. 17/906,460.
(Continued)

*Primary Examiner* — Dale E Page
*Assistant Examiner* — Cristian A Tivarus
(74) *Attorney, Agent, or Firm* — Studebaker Brackett PLLC

(57) ABSTRACT

Provided is a cooler that is less likely to cause an uneven degree of cooling during cooling of multiple cooling targets. The cooler is thus provided inside with a flow path of a refrigerant, the flow path including: an outer-peripheral-side header region that is provided on an outer peripheral side of an annular shape and extends in a circumferential direction of the annular shape; an inner-peripheral-side header region that is provided on an inner peripheral side of the annular shape across a separation region from the outer-peripheral-side header region and extends in the circumferential direction; and a fin region serving as the separation region in which a fin is disposed.

18 Claims, 5 Drawing Sheets

(51) Int. Cl.
    *H02K 11/33*    (2016.01)
    *H02M 1/32*    (2007.01)

(56)          References Cited

U.S. PATENT DOCUMENTS

| | | | |
|---|---|---|---|
| 10,900,412 B2 * | 1/2021 | Carter | F02B 39/10 |
| 2004/0183385 A1 * | 9/2004 | Takahashi | H01L 23/3672 |
| | | | 310/58 |
| 2005/0103472 A1 * | 5/2005 | Lofland | F28F 3/12 |
| | | | 257/E23.098 |
| 2008/0237847 A1 | 10/2008 | Nakanishi et al. | |
| 2018/0084673 A1 * | 3/2018 | Asai | H05K 7/20936 |
| 2018/0277730 A1 | 9/2018 | Nagase et al. | |
| 2020/0118986 A1 * | 4/2020 | Hori | H01L 23/427 |
| 2021/0067002 A1 * | 3/2021 | Higashino | H02K 5/141 |

FOREIGN PATENT DOCUMENTS

| | | | | | |
|---|---|---|---|---|---|
| JP | H07-298552 | A | | 11/1995 | |
| JP | 2005-150755 | A | | 6/2005 | |
| JP | 2007116840 | A | * | 5/2007 | |
| JP | 2010028958 | A | * | 2/2010 | |
| JP | 4708951 | B2 | | 6/2011 | |
| JP | 2015038903 | A | * | 2/2015 | H01L 23/36 |
| WO | 2013/065427 | A1 | | 5/2013 | |

OTHER PUBLICATIONS

An Office Action mailed by China National Intellectual Property Administration on Jun. 28, 2024, which corresponds to Chinese Patent Application No. 202080101360.4 and is related to U.S. Appl. No. 17/906,460; with English language translation.
International Search Report issued in PCT/JP2020/021280; mailed Aug. 25, 2020.

\* cited by examiner

FIG. 1                                    10 (210)
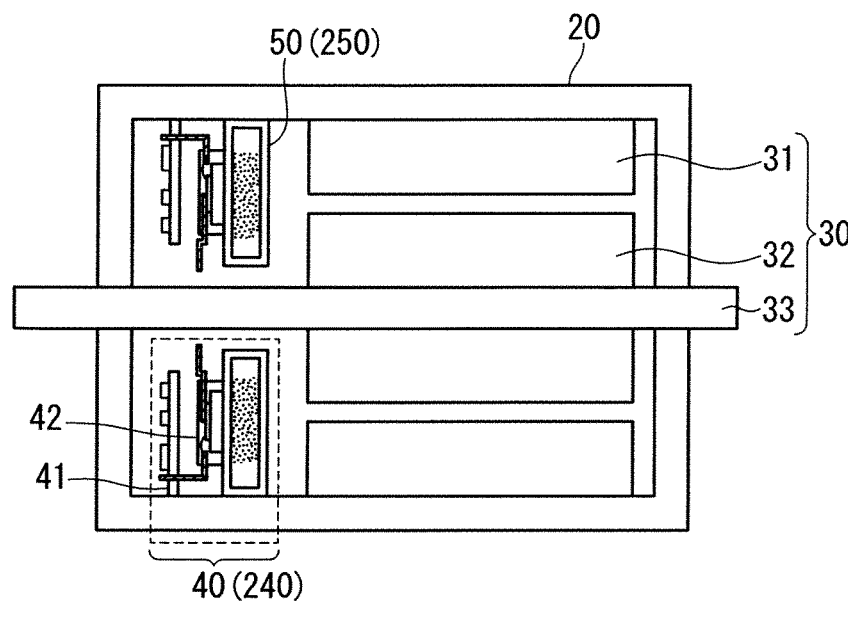
FIG. 2
40 (240)
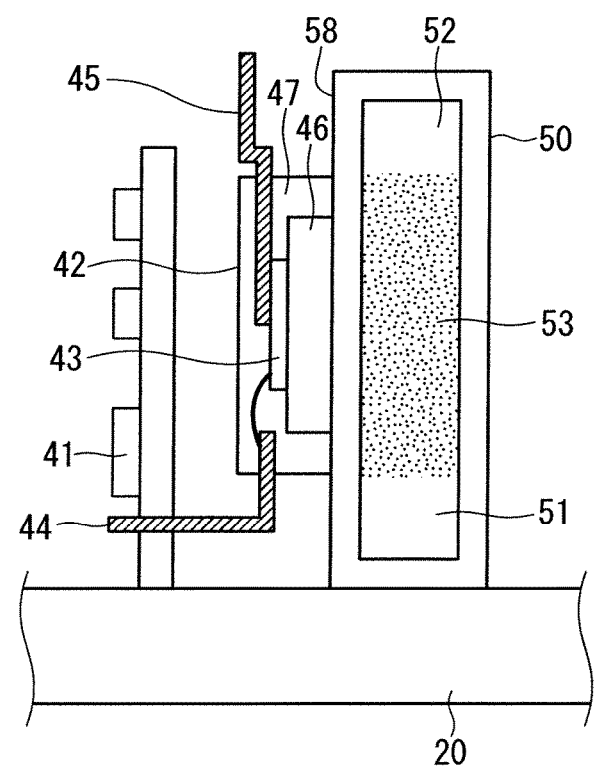

F I G. 7
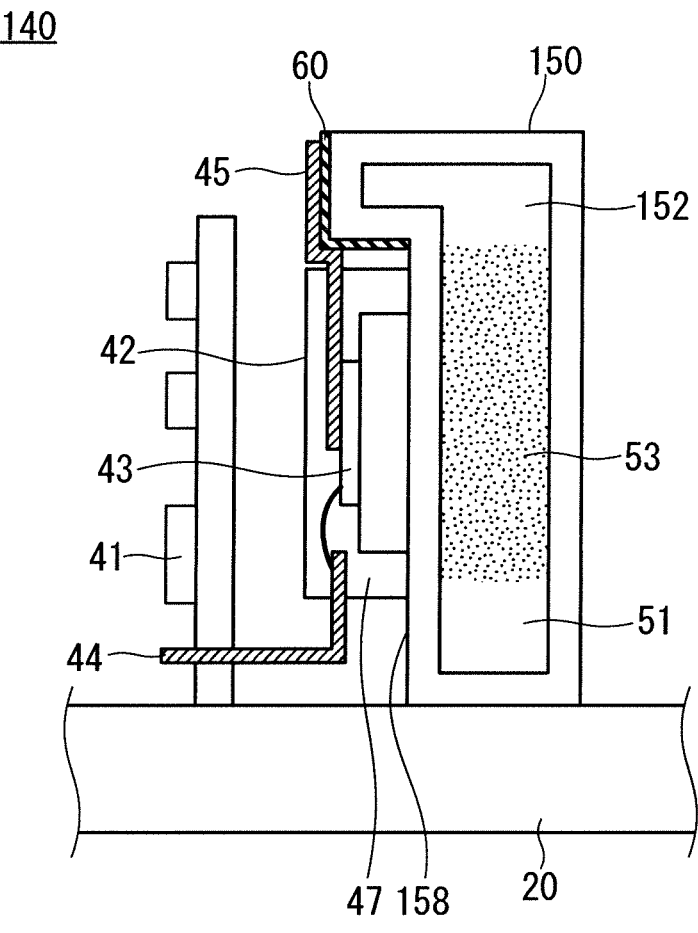

F I G. 8
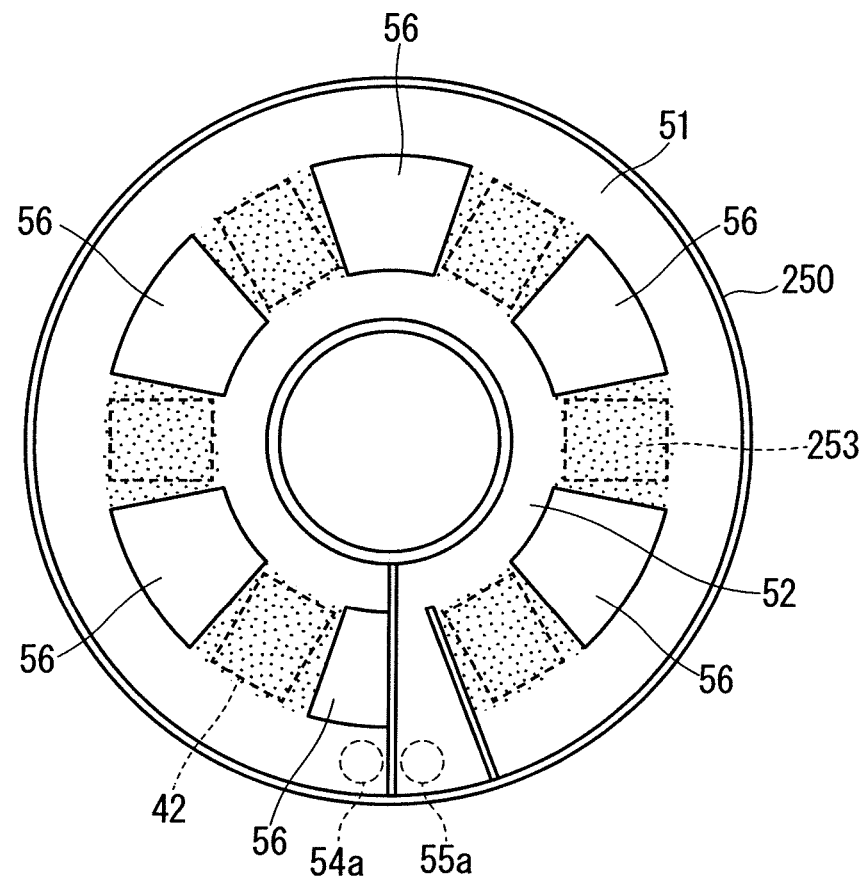

COOLER AND SEMICONDUCTOR DEVICE

TECHNICAL FIELD

The present disclosure relates to a cooler and a semiconductor device.

BACKGROUND ART

Inverters and motors of electric vehicles such as an electric motor vehicle and a hybrid vehicle have been conventionally surrounded by separate metallic housings, but have been developed to be integrated with each other for the purpose of miniaturization and space saving. The inverters receive direct currents supplied from batteries and convert the direct currents into three-phase alternating currents to supply the three-phase alternating currents to the motors. The inverters generate heat due to energy loss of semiconductor elements when converting the direct currents into the three-phase alternating currents. When the semiconductor elements are used at a high temperature, the elements themselves, bonding materials, peripheries of bonding parts, and the like may be broken, and thus the semiconductor elements need to be used while being cooled.

For example, Patent Document 1 discloses a configuration of a cooler that cools multiple semiconductor elements used in an inverter.

PRIOR ART DOCUMENTS

Patent Documents

Patent Document 1: Japanese Patent No. 4708951

SUMMARY

Problem to be Solved by the Invention

FIG. 24 shown in Patent Document 1 illustrates the cooler in which coolant flows through a flow path while taking away heat generated by the multiple semiconductor elements. As the coolant flows through the flow path, the coolant rises in temperature due to the heat of the semiconductor elements, and thus cooling effect decreases. As described above, conventional coolers are likely to cause an uneven degree of cooling during cooling of multiple cooling targets.

The present disclosure is made to solve such a problem, and an object of the present disclosure is to provide a cooler that is less likely to cause an uneven degree of cooling during cooling of multiple cooling targets, and a semiconductor device using the cooler that is less likely to cause the uneven degree of cooling during cooling of the multiple cooling targets.

Means to Solve the Problem

A cooler according to the present disclosure has an annular shape in plan view from a first direction and is provided inside with a flow path of a refrigerant, the flow path including: an outer-peripheral-side header region that is provided on an outer peripheral side of the annular shape and extends in a circumferential direction of the annular shape; an inner-peripheral-side header region that is provided on an inner peripheral side of the annular shape across a separation region from the outer-peripheral-side header region and extends in the circumferential direction; and a fin region serving as the separation region in which a fin is disposed.

Additionally, a semiconductor device of the present disclosure includes the cooler of the present disclosure and multiple semiconductor modules, the multiple semiconductor modules being disposed on a module placement surface of the cooler extending in a second direction intersecting a first direction and a third direction intersecting the first direction and the second direction.

Effects of the Invention

In the cooler of the present disclosure, the flow path includes the outer-peripheral-side header region that is provided on the outer peripheral side of the annular shape and extends in the circumferential direction of the annular shape, the inner-peripheral-side header region that is provided on the inner peripheral side of the annular shape across the separation region from the outer-peripheral-side header region and extends in the circumferential direction, and the fin region serving as the separation region in which the fin is disposed. As a result, the cooler of the present disclosure is less likely to cause an uneven degree of cooling when cooling a plurality of cooling targets.

Additionally, a semiconductor device of the present disclosure includes the cooler of the present disclosure and multiple semiconductor modules, the multiple semiconductor modules being disposed on a module placement surface of the cooler extending in a second direction intersecting a first direction and a third direction intersecting the first direction and the second direction. As a result, the semiconductor device of the present disclosure uses the cooler that is less likely to cause an uneven degree of cooling during cooling of the multiple cooling targets.

Detailed description below and accompanying drawings will clarify features, aspects, and advantages of the present disclosure.

BRIEF DESCRIPTION OF DRAWINGS

FIG. 1 is a sectional view of a semiconductor device according to a first embodiment.

FIG. 2 is a sectional view of an inverter unit of the first embodiment.

FIG. 7 is a sectional view of an inverter unit of a second embodiment.

FIG. 8 is a sectional view of a cooler of a third embodiment taken along a plane perpendicular to the axis of the shaft of the semiconductor device.

DESCRIPTION OF EMBODIMENTS

A. First Embodiment

A-1. Configuration

Figure 3:
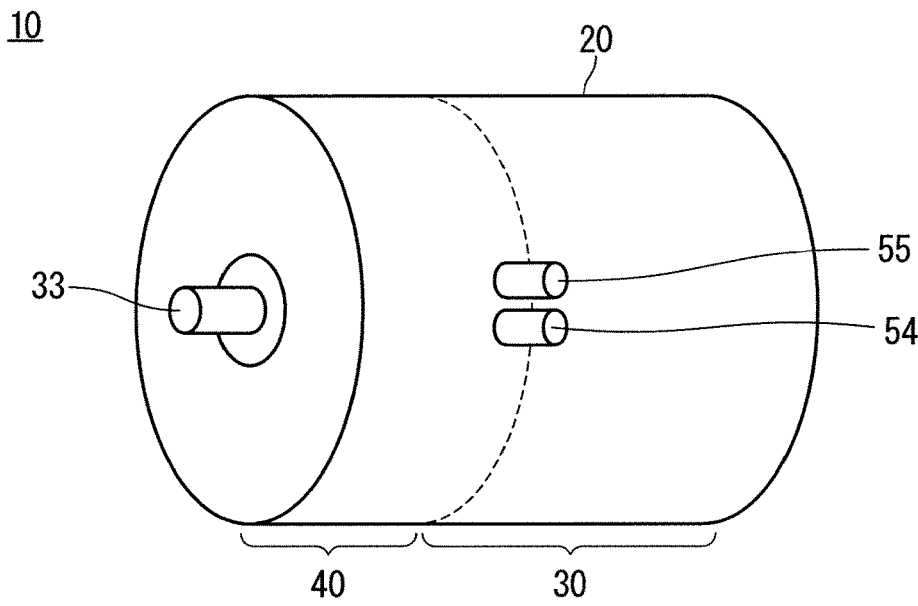
FIG. 3 is a perspective view of the semiconductor device of the first embodiment.

FIG. 1 is a sectional view of a semiconductor device 10 as an inverter device of a first embodiment, and FIG. 3 is a perspective view illustrating an external appearance of the semiconductor device 10.

The semiconductor device 10 includes a housing 20, a motor unit 30, and an inverter unit 40. The semiconductor device 10 includes the motor unit 30 that operates as a motor, and is a motor-integrated semiconductor device.

FIG. 2 is a sectional view of the inverter unit 40 of the first embodiment, and is an enlarged view of a region surrounded by a broken line in FIG. 1.

The housing 20 is made of metal and has a cylindrical shape as illustrated in FIG. 3.

The motor unit 30 includes a stator 31, a rotor 32, and a shaft 33.

The shaft 33 is rotatably supported by the housing 20 with a bearing, and is disposed passing through a central axis of the cylindrical shape of the housing 20. The shaft 33 partly protrudes outward from the housing 20.

The shaft 33 is fixed to the rotor 32 of a permanent magnet having one pair or multiple pairs of an S pole and an N pole. The rotor 32 is configured to be rotatable with respect to the housing 20 integrally with the shaft 33.

The stator 31 fixed to the housing 20 is disposed outside the rotor 32. The stator 31 includes an electromagnet including a stator core fixed to the housing 20 and a stator coil wound around the stator core. The number of electromagnets included in the stator 31 is three, six, or nine, which is a multiple of three and in accordance with torque or rotation speed required for the motor. The stator 31 receives a three-phase alternating current supplied from the inverter unit 40. However, the stator 31 may use a multiphase alternating current other than the three-phase alternating current, and in this case, the number of electromagnets included in the stator 31 is not necessarily a multiple of three.

The inverter unit 40 includes multiple semiconductor modules 42, a control board 41, and a cooler 50. The semiconductor modules 42 are each a cooling target for the cooler 50.

The inverter unit 40 supplies a three-phase alternating current to the stator 31. For example, the inverter unit 40 converts a direct current supplied from a battery outside the semiconductor device 10 into an alternating current to supply the alternating current to the stator 31. The inverter unit 40 includes as many semiconductor modules 42 as necessary for generating an alternating current to be supplied to the stator 31. The present embodiment is described in which six semiconductor modules 42 are provided.

Figure 4:
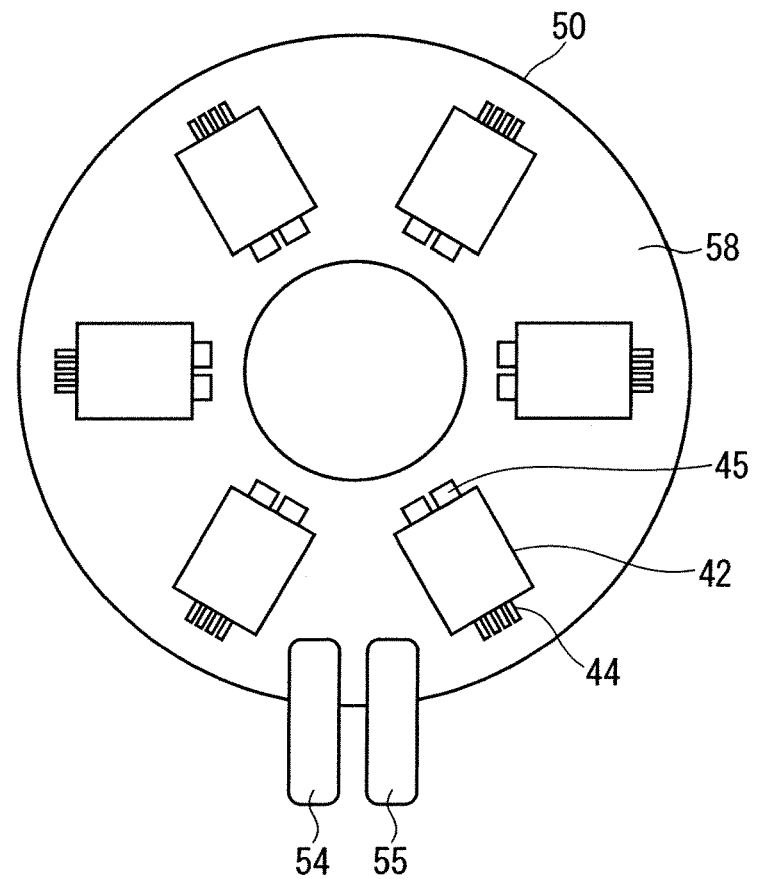
FIG. 4 is a plan view of a cooler of the first embodiment as viewed from an axial direction of a shaft of the semiconductor device.

FIG. 4 is a plan view of the cooler 50 as viewed from a first direction. The first direction is an axial direction of the shaft 33 in FIG. 1. As illustrated in FIG. 4, the cooler 50 has an annular shape in plan view as viewed from the first direction. FIG. 4 also illustrates the semiconductor modules 42 disposed on a surface of the cooler 50. The present disclosure is described in which a simple annular shape means an annular shape in plan view where each of coolers 50, 150, and 250 of respective embodiments is viewed from the first direction. Additionally, a simply described circumferential direction or radial direction means the circumferential direction or the radial direction of the annular shape in plan view where each the coolers 50, 150, and 250 of respective embodiments is viewed from the first direction.

Figure 5:
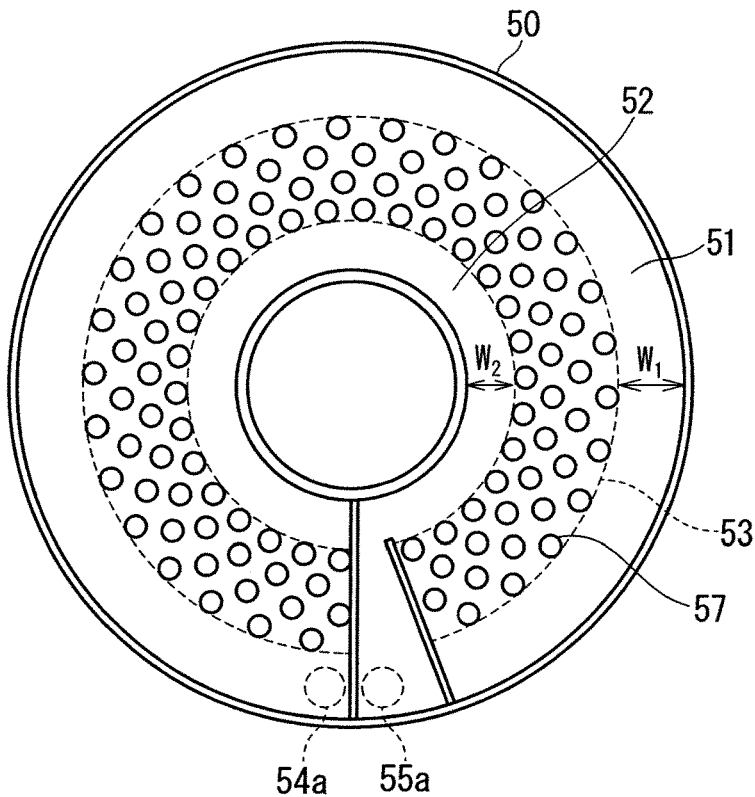
FIG. 5 is a sectional view of the cooler of the first embodiment taken along a plane perpendicular to an axis of the shaft of the semiconductor device.
Figure 6:
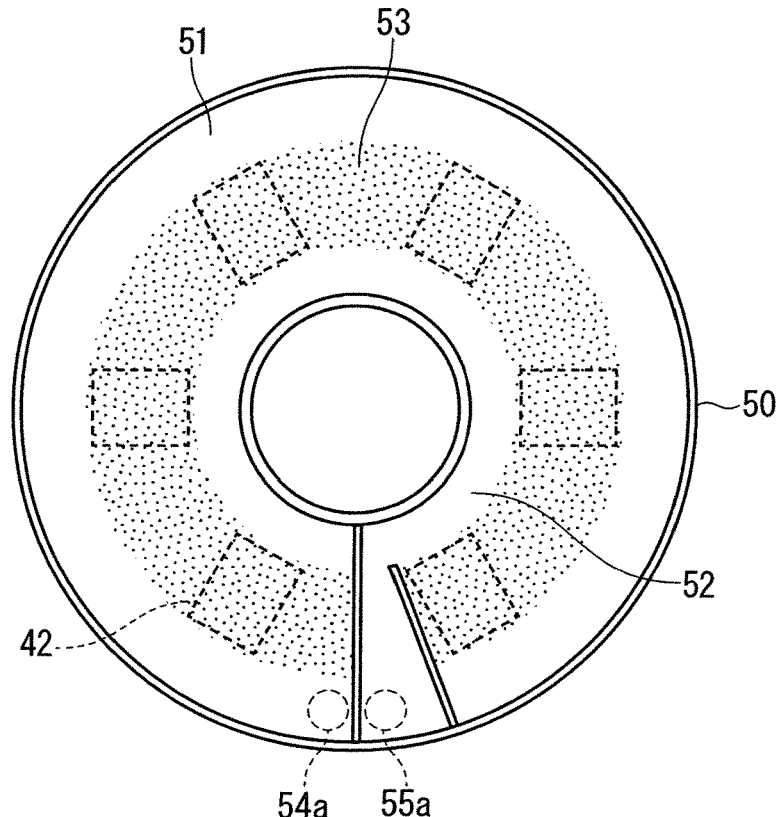
FIG. 6 is a sectional view of the cooler of the first embodiment taken along a plane perpendicular to the axis of the shaft of the semiconductor device.

The cooler 50 is provided inside with a flow path of a refrigerant. The refrigerant is cooling water, for example. FIGS. 5 and 6 are each a sectional view of the cooler 50 taken along a plane perpendicular to the first direction and passing through the flow path of a refrigerant. FIG. 6 illustrates a position of each of the semiconductor modules 42 with a broken line in plan view from the first direction.

The cooler 50 includes an outer-peripheral-side pipe 54 and an inner-peripheral-side pipe 55. FIGS. 5 and 6 each illustrate positions of an outer-peripheral-side pipe connection region 54a where the outer-peripheral-side pipe 54 is connected to a frame body of the cooler 50 and an inner-peripheral-side pipe connection region 55a where the inner-peripheral-side pipe 55 is connected to the frame body of the cooler 50 in plan view from the first direction. The inner-peripheral-side pipe 55 and the outer-peripheral-side pipe 54 are connected with a flow path inside the cooler 50, the flow path including an outer-peripheral-side header region 51, an inner-peripheral-side header region 52, and a fin region 53.

The outer-peripheral-side header region 51 is provided on the outer peripheral side of the annular shape and extends in the circumferential direction.

The inner-peripheral-side header region 52 is provided on the inner peripheral side of the annular shape across a separation region from the outer-peripheral-side header region 51 and extends in the circumferential direction.

In the present embodiment, the separation region is the same as the fin region 53. The fin region 53 is provided in a region radially interposed between the inner-peripheral-side header region 52 and the outer-peripheral-side header region 51, and extends in the circumferential direction. As illustrated in FIG. 5, fins 57 are disposed in the fin region 53. The fin region 53 allows the refrigerant to flow between the outer-peripheral-side header region 51 and the inner-peripheral-side header region 52. FIGS. 1, 2, and 6 each illustrate the fin region 53 in a dot pattern for clarity.

The fins 57 desirably pin fins or corrugated fins, have high cooling efficiency, for example. FIG. 5 illustrates the fins 57 as pin fins.

Even when the outer-peripheral-side header region 51 and the inner-peripheral-side header region 52 are identical in width of angle in the circumferential direction, the outer-peripheral-side header region 51 is longer in circumferential length than the inner-peripheral-side header region 52. This configuration causes a pressure difference in the circumferential direction of the refrigerant to be more likely to occur in the outer-peripheral-side header region 51 than in the inner-peripheral-side header region 52. To reduce the pressure difference of the refrigerant in the circumferential direction in the outer-peripheral-side header region 51, the outer-peripheral-side header region 51 desirably has a radial width $W_1$ larger than a radial width $W_2$ of the inner-peripheral-side header region 52. The reduction in the pressure difference of the refrigerant in the circumferential direction in the outer-peripheral-side header region 51 causes the cooler 50 to be less likely to have an uneven degree of cooling during cooling of the multiple cooling targets. FIG. 5 shows $W_1$ and $W_2$.

Each of the outer-peripheral-side header region 51 and the inner-peripheral-side header region 52 desirably has almost no flow path resistance to the refrigerant. In particular, the outer-peripheral-side header region 51 and the inner-peripheral-side header region 52 each desirably have sufficiently smaller flow path resistance to the refrigerant than the fin region 53.

Each semiconductor module 42 includes a semiconductor element 43, a heat spreader 46, a main terminal 45, a signal terminal 44, and a sealing resin 47. The semiconductor element 43 is joined to the heat spreader 46 with a brazing material such as solder, and sealed with the sealing resin 47. The semiconductor module 42 has a surface from which the heat spreader 46 is exposed. The main terminal 45 and the signal terminal 44 are each connected on one side to the semiconductor element 43, and are out of the sealing resin 47 on the other side. However, the configuration of the semiconductor module 42 is not limited to such an example. For example, the semiconductor module 42 may not include the heat spreader 46, and the semiconductor element 43 itself may serve as the semiconductor module 42.

As illustrated in FIG. 4, the multiple semiconductor modules 42 are disposed on a module placement surface 58 of the cooler 50 extending in a second direction intersecting the first direction and a third direction intersecting the first direction and the second direction. The multiple semiconductor modules 42 are disposed side by side in the circumferential direction on the module placement surface 58, and are uniformly cooled by the cooler 50. Although in the present embodiment, the first direction illustrated is perpendicular to a plane defined by the second direction and the third direction, the first direction is not necessarily perpendicular to the plane defined by the second direction and the third direction.

Each of the semiconductor modules 42 is disposed with the heat spreader 46 in contact with the module placement surface 58 of the cooler 50. The module placement surface 58 includes a part corresponding to the fin region 53, the part having higher cooling capacity than another part, so that each of the semiconductor modules 42 is disposed on the module placement surface 58 of the cooler 50 while having the region of the heat spreader 46 overlapping the fin region 53 in plan view from the first direction. The term, "overlapping", includes a case of partially overlapping.

To sufficiently utilize the cooling capacity of the fin region 53, each of the semiconductor modules 42 is desirably disposed on the module placement surface 58 of the cooler 50 while having the region of the heat spreader 46 included in the fin region 53 in plan view from the first direction. In consideration of diffusion of heat transferred from the heat spreader 46 to the cooler 50 at an outer wall of the cooler 50, the fin region 53 more desirably includes a part from the region of the heat spreader 46 of each semiconductor module 42 to the outside by a distance equal to or more than a thickness of the outer wall of the cooler 50, in plan view from the first direction.

Between each semiconductor module 42 and the cooler 50, filler-containing grease is used to fill a minute gap to facilitate heat transfer, for example. Each of the semiconductor modules 42 is pressed against the cooler 50 with a spring or a screw (not illustrated).

Each of the semiconductor modules 42 and the stator coil of the stator 31 are connected with a bus bar or a lead wire (not illustrated) disposed inside the housing 20, and a three-phase alternating current is supplied from the inverter unit 40 to the stator coil of the stator 31. For example, a bus bar or a lead wire for inputting a direct current from a battery outside the housing 20 to each of the semiconductor modules 42 is required to operate the semiconductor device 10, but is not illustrated in the drawing.

The control board 41 is configured to detect an input signal, a current, and a temperature to the semiconductor module 42 through the signal terminal 44, and protects the semiconductor element 43.

The control board 41 and the cooler 50 each have an annular shape with a hole in the center when viewed from the axial direction of the shaft 33, the annular shape having an outer peripheral part attached and fixed to the housing 20. The control board 41 and the cooler 50 are fixed to the housing 20 with the shaft 33 passing through the hole of the annular shape of each of the control board 41 and the cooler 50.

A-2. Operation

The inverter unit 40 converts a direct current into an alternating current by causing the multiple semiconductor elements 43 to sequentially switch, and then Joule heat is generated by resistance and a current of each of the semiconductor elements 43. Each semiconductor element 43 and its peripheral components individually have a heat-resistant temperature unique to material, and are individually required to be maintained at the heat-resistant temperature or lower. Joined materials each have a different linear expansion coefficient, and thus have a different amount of expansion and contraction in accordance with change in temperature. The materials are joined at a part where distortion occurs due to the different amount of expansion and contraction, so that the part cracks or peels. Thus, the cooler 50 cools the semiconductor module 42 to keep the temperature of the semiconductor module 42 at a certain temperature or lower. The multiple semiconductor modules 42 are desirably cooled uniformly.

The refrigerant flows in a direction that depends on a direction in which a pump, which is not illustrated and is not included in the cooler 50, is connected to the outer-peripheral-side pipe 54 and the inner-peripheral-side pipe 55. In the present embodiment, the refrigerant flows in a direction in which the refrigerant is taken into the cooler 50 from the inner-peripheral-side pipe 55 and discharged to the outside of the cooler 50 from the outer-peripheral-side pipe 54. That is, the cooler 50 takes in the refrigerant through the inner-peripheral-side pipe 55 to cause the refrigerant to flow from the inner-peripheral-side header region 52 toward the outer-peripheral-side header region 51 through the fin region 53, and discharges the refrigerant from the outer-peripheral-side pipe 54 to the outside of the cooler 50. When the pump is inversely connected to the outer-peripheral-side pipe 54 and the inner-peripheral-side pipe 55, the refrigerant can flow in a direction opposite to the above direction. The cooler 50 may also include a pump.

The inner-peripheral-side header region 52 and the outer-peripheral-side header region 51 each have the sufficiently smaller flow path resistance than the fin region 53. Thus, when the refrigerant flows through the flow path of the cooler 50, the inner-peripheral-side header region 52 and the outer-peripheral-side header region 51 are each under substantially uniform pressure. This causes a pressure gradient to be generated in the fin region 53 in the radial direction. For example, a pressure difference between first and second ends of the inner-peripheral-side header region 52, the first end being close to the inner-peripheral-side pipe connection region 55a, and the second end being close to the outer-peripheral-side pipe connection region 54a, and a pressure difference between third and fourth ends of the outer-peripheral-side header region 51, the third end being close to inner-peripheral-side pipe connection region 55a, and the fourth end being close to the outer-peripheral-side pipe connection region 54a, are smaller than a pressure difference between the first end of the inner-peripheral-side header region 52, the first end being close to the inner-peripheral-side pipe connection region 55a, and the third end of the outer-peripheral-side header region 51, the third end close to the inner-peripheral-side pipe connection region 55a, and a pressure difference between the second end of the inner-peripheral-side header region 52, the second end being close to the outer-peripheral-side pipe connection region 54a, and the fourth end of the outer-peripheral-side header region 51, the fourth end being close to the outer-peripheral-side pipe connection region 54*a*. Here, the pressure difference is an absolute value.

The semiconductor modules 42 each generate heat that is transferred to the refrigerant through the outer wall of the cooler 50 or to the refrigerant through the outer wall of the cooler 50 and the fins 57. As a result, the semiconductor modules 42 are cooled.

The refrigerant is under substantially uniform pressure in each of the inner-peripheral-side header region 52 and the outer-peripheral-side header region 51, so that the refrigerant flows in the fin region 53 in parallel in the circumferential direction from the inner-peripheral-side header region 52 toward the outer-peripheral-side header region 51 at a substantially uniform flow rate, and thus the fin region 53 has cooling capacity that is substantially uniform in the circumferential direction. Thus, the multiple semiconductor modules 42 disposed side by side in the circumferential direction on the module placement surface 58 is cooled substantially uniformly.

As described above, the flow path of the cooler 50 includes the outer-peripheral-side header region 51 provided on the outer peripheral side of the annular shape and extending in the circumferential direction, the inner-peripheral-side header region 52 provided on the inner peripheral side of the annular shape across the separation region from the outer-peripheral-side header region 51 and extending in the circumferential direction, and the fin region 53 serving as the separation region in which the fins 57 are disposed, thereby causing the cooler 50 to be less likely to cause an uneven degree of cooling during cooling of the multiple cooling targets.

The motor unit 30 is configured such that a three-phase alternating current is applied to the stator 31 to generate a magnetic field, and the rotor 32 is rotated to convert electric energy into kinetic energy. However, the conversion efficiency is not 100%, and a part of the energy is lost. Then, most of the loss is converted into heat. Thus, the motor unit 30 also needs to be cooled as necessary, but the cooling of the motor unit 30 is eliminated in the drawing of the present embodiment.

When the motor unit 30 generates heat, the heat is transferred to the inverter unit 40 through the housing 20 made of metal. The cooler 50 is fixed to the housing 20 on the outer peripheral side, so that the cooler 50 may rise in temperature on its outer peripheral side, and thus the refrigerant in the outer-peripheral-side header region 51 may also rise in temperature. However, the refrigerant flows through the inner-peripheral-side header region 52, the fin region 53, and the outer-peripheral-side header region 51 in this order. Thus, the refrigerant flows in the outer-peripheral-side header region 51 after cooling the semiconductor modules 42, so that the cooling of the semiconductor modules 42 with the fin region 53 can be less likely to be affected by heat generated by the motor unit 30.

A-3. Effect

The flow path of the cooler 50 includes the outer-peripheral-side header region 51 provided on the outer peripheral side of the annular shape and extending in the circumferential direction, the inner-peripheral-side header region 52 provided on the inner peripheral side of the annular shape across the separation region from the outer-peripheral-side header region 51 and extending in the circumferential direction, and the fin region 53 serving as the separation region in which the fin 57 is disposed. As a result, the cooler 50 is less likely to cause an uneven degree of cooling during cooling of multiple cooling targets.

The cooler 50 causes the refrigerant to flow from the inner-peripheral-side header region 52 toward the outer-peripheral-side header region 51 through the fin region 53. As a result, the cooling with the fin region 53 can be less likely to be affected by heat transferred from the housing 20 fixing the cooler 50 on the outer peripheral side to the cooler 50.

The cooler 50 includes the outer-peripheral-side header region 51 that desirably has a wider radial width than the inner-peripheral-side header region 52. As a result, the cooler 50 is lesser likely to cause an uneven degree of cooling during cooling of multiple cooling targets.

The multiple semiconductor modules 42 in the semiconductor device 10 are disposed on the module placement surface 58 of the cooler 50. This configuration enables the multiple semiconductor modules 42 to be cooled by the cooler 50.

The multiple semiconductor modules 42 in the semiconductor device 10 are disposed side by side in the circumferential direction on the module placement surface 58 of the cooler 50. This configuration enables the multiple semiconductor modules 42 to be cooled more uniformly by the cooler 50.

The multiple semiconductor modules 42 in the semiconductor device 10 are each disposed on the module placement surface 58 of the cooler 50 with the heat spreader 46 in the region overlapping the fin region 53 in plan view from the first direction. This configuration enables the multiple semiconductor modules 42 to be cooled by the fin region 53.

The multiple semiconductor modules 42 in the semiconductor device 10 are each desirably disposed on the module placement surface 58 of the cooler 50 with the heat spreader 46 in a region included in the fin region 53 in plan view from the first direction. This configuration enables the multiple semiconductor modules 42 to be efficiently cooled by the fin region 53.

The fin region 53 in the semiconductor device 10 desirably includes a part from the region of the heat spreader 46 of each of the multiple semiconductor modules 42 to the outside by a distance equal to or more than a thickness of the outer wall of the cooler 50, in plan view from the first direction. This configuration enables the multiple semiconductor modules 42 to be more efficiently cooled by the fin region 53.

The semiconductor device 10 is a motor-integrated semiconductor device. As a result, a motor-integrated semiconductor device capable of cooling the multiple semiconductor modules 42 with the cooler 50 is fabricated.

B. Second Embodiment

B-1. Configuration and Operation

A semiconductor device of the present embodiment includes an inverter unit 140 instead of the inverter unit 40 as compared with the semiconductor device 10. Other aspects of the semiconductor device of the present embodiment are identical to the semiconductor device 10.

FIG. 7 is a diagram illustrating a half of a section of the inverter unit 140, and is a diagram corresponding to FIG. 2 illustrating the inverter unit 40 of the first embodiment.

The inverter unit 140 includes a cooler 150 instead of the cooler 50 as compared with the inverter unit 40. The cooler 150 in the inverter unit 140 cools a main terminal 45 of a semiconductor module 42. Other aspects of the inverter unit 140 are similar to the inverter unit 40.

The cooler 150 is provided inside with a flow path of a refrigerant, the flow path including: an outer-peripheral-side header region 51 that is provided on an outer peripheral side of an annular shape and extends in the circumferential direction of the annular shape; an inner-peripheral-side header region 152 that is provided on an inner peripheral side of the annular shape across a separation region from the outer-peripheral-side header region 51 and extends in the circumferential direction; and a fin region 53 serving as the separation region in which a fin 57 is disposed. The outer-peripheral-side header region 51 and the fin region 53 are similar to those of the cooler 50 of the first embodiment.

The inner-peripheral-side header region 152 has a wider width in a first direction than the fin region 53. This configuration enables increase in sectional area of the flow path of the inner-peripheral-side header region 152, so that flow path resistance of the inner-peripheral-side header region 152 can be lowered to uniform internal pressure of the inner-peripheral-side header region 152, and thus the fin region 53 has cooling capacity that is more uniform in the circumferential direction. FIG. 7 illustrates the fin region 53 in a dot pattern for clarity.

A module placement surface 158 of the cooler 150 extending in a second direction intersecting the first direction and a third direction intersecting the first direction and the second direction includes a part corresponding to the inner-peripheral-side header region 152, the part protruding from a part corresponding to the fin region 53. This can easily achieve a configuration in which the inner-peripheral-side header region 152 has a wider width in the first direction than the fin region 53.

The inverter unit 140 is configured such that the main terminal 45 of each semiconductor module 42 is in contact with the protruding part of the module placement surface 158 with an insulating material 60 interposed therebetween. The insulating material 60 is a glass coat, for example. The main terminal 45 may be heated to a high temperature due to heat generated by a large current flowing to drive a motor unit 30 or heat transferred from the semiconductor element 43 because of being joined to the semiconductor element 43. The main terminal 45 is cooled by being connected with the protruding part of the module placement surface 158 with the insulating material 60 interposed therebetween. The main terminal 45 has a smaller heating value than the semiconductor element 43, so that cooling with a part corresponding to the inner-peripheral-side header region 152 instead of the fin region 53 is sufficient. The main terminal 45 is in contact with the part of the module placement surface 158 of the cooler 150, the part protruding from the part corresponding to the fin region 53, and thus facilitating wiring for cooling the main terminal 45 with the cooler 150.

Although the above description shows that the inner-peripheral-side header region 152 has the wider width in the first direction than the fin region 53, at least one of the outer-peripheral-side header region 51 and the inner-peripheral-side header region 152 may have a wider width in the first direction than the fin region 53. This configuration also enables increase in sectional area of the flow path in the at least one region, so that flow path resistance in the at least one region can be lowered to uniform internal pressure in the at least one region, and thus the fin region 53 has cooling capacity that is more uniform in the circumferential direction. That is, the cooler 150 is lesser likely to cause an uneven degree of cooling during cooling of multiple cooling targets.

When a part of the module placement surface 158 of the cooler 150, the part corresponding to the one region, protrudes from the part corresponding to the fin region 53, a configuration in which the at least one region has a wider width in the first direction than the fin region 53 can be easily achieved. When the main terminal 45 of each of the multiple semiconductor modules 42 is disposed in contact with the protruding part corresponding to the at least one region with the insulating material 60 interposed therebetween, the main terminal 45 can be cooled.

B-2. Effect

The cooler 150 may be configured such that at least one of the outer-peripheral-side header region 51 and the inner-peripheral-side header region 152 has a wider width in the first direction than the fin region 53. This configuration causes the cooler 150 to be lesser likely to cause an uneven degree of cooling during cooling of multiple cooling targets.

The module placement surface 158 of the cooler 150 may be configured such that a part corresponding to at least one region protrudes from a part corresponding to the fin region 53. This configuration can facilitate achieving the configuration of the cooler 150 in which at least one of the outer-peripheral-side header region 51 and the inner-peripheral-side header region 152 has a wider width in the first direction than the fin region 53.

The semiconductor device of the present embodiment is configured such that the main terminal 45 of each of the multiple semiconductor modules 42 is in contact with the protruding part of the module placement surface 158 with the insulating material 60 interposed therebetween. This configuration enables the main terminal 45 to be cooled. The main terminal 45 is in contact with the part of the module placement surface 158 of the cooler 150, the part protruding from the part corresponding to the fin region 53, and thus facilitating wiring for cooling the main terminal 45 with the cooler 150.

C. Third Embodiment

C-1 Configuration and Operation

As illustrated in FIGS. 5 and 6, the cooler 50 of the first embodiment includes the fin region 53 that extends in the circumferential direction, and the multiple semiconductor modules 42 that are disposed at intervals in a region corresponding to the fin region 53 of the module placement surface 58. Although the semiconductor modules 42 can be cooled by the fin region 53 in the configuration of the first embodiment, the refrigerant also flows in a part corresponding to the intervals between the semiconductor modules 42 in the fin region 53. Even when the refrigerant flows in a part in the fin region 53, the part corresponding to a part provided with no semiconductor module 42, the refrigerant is less likely to contribute to cooling of the semiconductor modules 42.

An inverter unit (referred to below as an inverter unit 240) provided in a semiconductor device (referred to below as a semiconductor device 210) of the present embodiment includes a cooler 250 instead of the cooler 50 as compared with the inverter unit 40 provided in the semiconductor device 10 of the first embodiment. Other aspects of the inverter unit 240 are identical to the inverter unit 40. The semiconductor device 210 is identical to the semiconductor device 10 except that the inverter unit 240 is provided instead of the inverter unit 40. A sectional view of the semiconductor device 210 is illustrated in FIG. 1 as in the first embodiment. An enlarged view of a region surrounded by a broken line in FIG. 1 of the inverter unit 240 is illustrated in FIG. 2. Then, a reference numeral of a component different in a reference numeral between the present embodiment and the first embodiment is indicated in parentheses in FIGS. 1 and 2.

FIG. 8 is a sectional view of the cooler 250 taken along a plane perpendicular to a first direction and passing through a flow path of the refrigerant. FIG. 8 illustrates a position of each of the semiconductor modules 42 with a broken line in plan view from the first direction.

As illustrated in FIGS. 1 and 8, the flow path inside the cooler 250, as with the flow path inside the cooler 50, includes an outer-peripheral-side header region 51 provided on an outer peripheral side of an annular shape and extending in the circumferential direction, and an inner-peripheral-side header region 52 provided on an inner peripheral side of the annular shape across a separation region from the outer-peripheral-side header region 51 and extending in the circumferential direction.

The cooler 250 includes a fin region 253 in which fins are disposed. The fin region 253 is provided in a separation region radially interposed between the inner-peripheral-side header region 52 and the outer-peripheral-side header region 51 to cause the refrigerant to flow between the inner-peripheral-side header region 52 and the outer-peripheral-side header region 51. The fin region 253 is intermittently provided in the circumferential direction. As a result, when the semiconductor modules 42 are each disposed in a region corresponding to the fin region 253 in the module placement surface 58, the semiconductor modules 42 can be efficiently cooled. The separation region in the present embodiment is obtained by combining the fin region 253 and a region occupied by metal blocks 56 described later, illustrated in FIG. 8. FIG. 8 illustrates the fin region 253 in a dot pattern for clarity. Although the fins disposed in the fin region 253 are each a pin fin or a corrugated fin, for example, as with the fins 57 disposed in the fin region 53 in the first embodiment, the fins are not illustrated.

As illustrated in FIG. 8, the semiconductor device 210 includes the multiple semiconductor modules 42 that are disposed overlapping respective fin regions 253 intermittently provided in the circumferential direction one by one, in plan view from the first direction. This configuration does not cause the refrigerant to flow to regions having low efficiency for cooling the respective multiple semiconductor modules 42 in the separation region, and thus each of the semiconductor modules 42 can be efficiently cooled.

As illustrated in FIG. 8, the multiple semiconductor modules 42 are each disposed on the module placement surface 58 of the cooler 250 with a heat spreader 46 in a region overlapping the fin region 253 in plan view from the first direction. The semiconductor modules 42 are each desirably disposed on the module placement surface 58 of the cooler 250 with the heat spreader 46 in a region included in the fin region 253 in plan view from the first direction. The fin region 253 desirably includes a part from the region of the heat spreader 46 of each of the semiconductor modules 42 to the outside by a distance equal to or more than a thickness of an outer wall of the cooler 250, in plan view from the first direction.

The cooler 250 further includes the metal blocks 56, and the metal blocks 56 are disposed in a region provided with no fin region 253 in the separation region. The metal blocks 56 are disposed in each of the intervening portions of the fin regions 253 provided intermittently. When a heating value of the semiconductor modules 42 temporarily increases, such as when a motor unit 30 is locked or when a high load is suddenly applied to the semiconductor modules 42 due to sudden acceleration of an electric vehicle using the semiconductor device 10, cooling with the fins 57 and a buffer due to heat capacity of metal blocks 56 can suppress a temperature rise. Thus, output of a pump (not illustrated) that causes the refrigerant to flow into the cooler 250 can be reduced.

Although aluminum is often used as material of a cooler, copper having a large heat capacity per volume is preferably used as material of the metal blocks 56 because effect of the metal blocks 56 increases as its heat capacity increases. In that case, the copper needs to be subjected to surface treatment such as plating to prevent corrosion. Copper is also suitable as a thermal buffer against a sudden increase in the heating value of the semiconductor modules 42, due to its higher thermal conductivity than aluminum.

Placement of the metal blocks 56 and the fins 57 in the cooler 250 can be changed in accordance with estimated placement of the semiconductor modules 42 on the cooler 250.

C-2. Effect

The cooler 250 includes the fin regions 253 that are intermittently provided in the circumferential direction. This configuration enables the semiconductor modules 42 to be efficiently cooled.

The cooler 250 further includes the metal blocks 56, and the metal blocks 56 are disposed in regions provided with no fin region 253 in the separation region. This configuration enables a temperature rise to be suppressed when the heating value of the semiconductor modules 42 temporarily increases.

The semiconductor device 210 includes the multiple semiconductor modules 42 that are disposed overlapping respective fin regions 253 intermittently provided in the circumferential direction one by one, in plan view from the first direction. This configuration enables each of the semiconductor modules 42 to be efficiently cooled.

D. Fourth Embodiment

The first to third embodiments each have no limitation on a type of semiconductor used for each of the semiconductor elements 43 built in the semiconductor module 42. The present embodiment uses any one of the coolers according to the first to third embodiments, and the semiconductor elements 43 include a wide band gap semiconductor. The wide band gap semiconductor has a larger band gap than silicon semiconductor and is, for example, a silicon carbide semiconductor. When the wide band gap semiconductor is included, a loss in normal operation decreases and a heat-resistant temperature increases.

The decrease in the loss in the normal operation and the increase in the heat-resistant temperature enables the metal block 56 to absorb the amount of heat during temperature increase from temperature in the normal operation to the heat-resistant temperature when the cooler 250 of the third embodiment is used as a cooler, the amount of heat being more than that when the semiconductor elements 43 do not include the wide band gap semiconductor, and thus the metal block 56 is further improved in function as a thermal buffer.

Although the present disclosure has been described in detail, the above description is illustrative and not restrictive in all aspects. Thus, it is perceived that countless modifications being not shown by way of example can be assumed.

EXPLANATION OF REFERENCE SIGNS

10, 210: semiconductor device
20: housing
30: motor unit
31: stator
32: rotor
33: shaft
40, 140, 240: inverter unit
41: control board
42: semiconductor module
43: semiconductor element
44: signal terminal
45: main terminal
46: heat spreader
47: sealing resin
50, 150, 250: cooler
51: outer-peripheral-side header region
52, 152: inner-peripheral-side header region
53, 253: fin region
54: outer-peripheral-side pipe
54*a*: outer-peripheral-side pipe connection region
55: inner-peripheral-side pipe
55*a*: inner-peripheral-side pipe connection region
56: metal block
57: fin
58, 158: module placement surface
60: insulating material

The invention claimed is:

1. A cooler having an annular shape in plan view from a first direction, the cooler comprising:
   a flow path of a refrigerant, the flow path being provided inside the cooler,
   the flow path including:
   an outer-peripheral-side header region that is provided on an outer peripheral side of the annular shape and extends in a circumferential direction of the annular shape;
   an inner-peripheral-side header region that is provided on an inner peripheral side of the annular shape across a separation region from the outer-peripheral-side header region and extends in the circumferential direction; and
   a fin region serving as the separation region in which a fin is disposed, wherein
   each of the outer-peripheral-side header region and the inner-peripheral-side header region has a smaller flow path resistance to the refrigerant than a flow path resistance of the fin region to the refrigerant.

2. The cooler according to claim 1, wherein the refrigerant is caused to flow from the inner-peripheral-side header region toward the outer-peripheral-side header region through the fin region.

3. The cooler according to claim 1, wherein the outer-peripheral-side header region has a wider width in radial direction of the annular shape than the inner-peripheral-side header region.

4. The cooler according to claim 1, wherein at least one region of the outer-peripheral-side header region and the inner-peripheral-side header region has a wider width in the first direction than the fin region.

5. The cooler according to claim 4, wherein the cooler has a surface extending in a second direction intersecting the first direction and a third direction intersecting the first direction and the second direction, the surface including a part corresponding to the at least one region, the part protruding from a part corresponding to the fin region.

6. The cooler according to claim 1, wherein the fin region is intermittently provided in the circumferential direction.

7. The cooler according to claim 6, further comprising:
   a metal block,
   wherein the metal block is disposed in a region of the separation region, the region being provided without the fin region.

8. A semiconductor device comprising:
   the cooler according to claim 1; and
   multiple semiconductor modules,
   the multiple semiconductor modules being disposed on a module placement surface of the cooler extending in a second direction intersecting the first direction and a third direction intersecting the first direction and the second direction.

9. The semiconductor device according to claim 8, wherein the multiple semiconductor modules are disposed side by side in the circumferential direction on the module placement surface of the cooler.

10. The semiconductor device according to claim 8, wherein
    each of the multiple semiconductor modules includes a heat spreader, and
    each of the multiple semiconductor modules is disposed on the module placement surface of the cooler with the heat spreader in a region overlapping the fin region in plan view from the first direction.

11. The semiconductor device according to claim 10, wherein the multiple semiconductor modules are each disposed on the module placement surface of the cooler with the heat spreader in the region included in the fin region in plan view from the first direction.

12. The semiconductor device according to claim 11, wherein the fin region includes a part from the region of the heat spreader of each of the multiple semiconductor modules to an outside by a distance equal to or more than a thickness of an outer wall of the cooler, in plan view from the first direction.

13. The semiconductor device according to claim 8, wherein
    at least one region of the outer-peripheral-side header region and the inner-peripheral-side header region has a wider width in the first direction than the fin region,
    the cooler has a surface extending in a second direction intersecting the first direction and a third direction intersecting the first direction and the second direction, the surface including a part corresponding to the at least one region, the part protruding from a part corresponding to the fin region,
    the multiple semiconductor modules each include a main terminal, and
    the main terminal of each of the multiple semiconductor modules is connected with the part protruding of the surface of the cooler extending in the second direction intersecting the first direction and the third direction intersecting the first direction and the second direction with an insulating material interposed between the main terminal and the part protruding.

14. The semiconductor device according to claim 8, wherein
    the fin region is intermittently provided in the circumferential direction, and
    the multiple semiconductor modules are disposed overlapping respective fin regions constituting the fin region intermittently provided in the circumferential direction one by one, in plan view from the first direction.

15. The semiconductor device according to claim 8, wherein the multiple semiconductor modules include a wide band gap semiconductor.

16. The semiconductor device according to claim 15, wherein the wide band gap semiconductor is a silicon carbide semiconductor.

17. The semiconductor device according to claim 8 which is motor integrated semiconductor device, further comprising:

a housing; and a motor unit;

the motor unit including a shaft rotatably supported by the housing, a rotor fixed to the shaft, and a stator fixed to the housing,

wherein the cooler is fixed to the housing with the shaft passing through a hole of the annular shape.

18. The cooler according to claim 1, wherein the inner-peripheral-side header region has a first end and a second end in the circumferential direction, the outer-peripheral-side header region has a third end and a fourth end in the circumferential direction, the third end being closer to the first end and the fourth end being closer to the second end, and an absolute value of a first pressure difference between the first end and the second end and an absolute value of a second pressure difference between the third end and the fourth end are each configured to be smaller than each of an absolute value of a third pressure difference between the first end and the third end and an absolute value of a fourth pressure difference between the second end and the fourth end.

* * * * *